United States Patent
Morimoto et al.

(10) Patent No.: US 7,106,139 B2
(45) Date of Patent: Sep. 12, 2006

(54) AMPLIFICATION CIRCUIT AND OSCILLATION CIRCUIT INCLUDING INVERTER CIRCUITS HAVING A SAME THRESHOLD VOLTAGE

(75) Inventors: Masashi Morimoto, Tokyo (JP); Shinsuke Onishi, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 129 days.

(21) Appl. No.: 10/173,925

(22) Filed: Jun. 19, 2002

(65) Prior Publication Data

US 2002/0190799 A1 Dec. 19, 2002

(30) Foreign Application Priority Data

Jun. 19, 2001 (JP) ............................. 2001-184774

(51) Int. Cl.
*H03L 7/085* (2006.01)
(52) U.S. Cl. .......................................... 331/1 A; 331/57
(58) Field of Classification Search ............... 331/1 A, 331/57
See application file for complete search history.

(56) References Cited

U.S. PATENT DOCUMENTS

| | | | | |
|---|---|---|---|---|
| 4,177,428 A | * | 12/1979 | Klank | 325/455 |
| 4,424,456 A | * | 1/1984 | Shiraki et al. | 327/111 |
| 4,851,792 A | * | 7/1989 | Ochiai et al. | 331/176 |
| 5,072,286 A | * | 12/1991 | Minami et al. | 257/208 |
| 5,166,902 A | * | 11/1992 | Silver | 365/182 |
| 5,545,941 A | * | 8/1996 | Soneda et al. | 310/318 |
| 5,675,294 A | * | 10/1997 | Shyu et al. | 331/75 |
| 5,751,180 A | * | 5/1998 | D'Addeo | 327/379 |
| 5,821,783 A | * | 10/1998 | Torimaru et al. | 327/108 |
| 6,208,182 B1 | * | 3/2001 | Marbot et al. | 327/158 |
| 6,429,684 B1 | * | 8/2002 | Houston | 326/83 |
| 6,556,094 B1 | * | 4/2003 | Hasegawa et al. | 331/158 |

FOREIGN PATENT DOCUMENTS

| JP | 2-10869 | 1/1990 |
|---|---|---|
| JP | 5-267935 | 10/1993 |

* cited by examiner

*Primary Examiner*—Kenneth B. Wells
(74) *Attorney, Agent, or Firm*—VolentineFrancos&Whitt,PLLC

(57) ABSTRACT

A first inverter includes a plurality of first gate elements having first gate electrodes which extend in a first direction. A second inverter includes a plurality of second gate elements having second gate electrodes which extend in the first direction. A gate length of the first gate electrodes is the same as a gate length of the second gate electrodes, and a gate width of the first gate electrodes which is defined by a first active region, is the same as a gate width of the second gate electrodes which is defined by a second active region.

20 Claims, 6 Drawing Sheets

US 7,106,139 B2

AMPLIFICATION CIRCUIT AND OSCILLATION CIRCUIT INCLUDING INVERTER CIRCUITS HAVING A SAME THRESHOLD VOLTAGE

CROSS REFERENCE TO RELATED APPLICATION

The present application claims priority under 35 U.S.C. § 119 to Japanese Patent Application No. 2001-184774, filed Jun. 19, 2001, which is herein incorporated by reference in its entirely for all purposes.

BACKGROUND OF THE INVENTION

1. Field of the Invention

The present invention relates to an amplification circuit amplifying a pulse signal (e.g., a clock pulse signal), and more particularly to the amplification circuit which will be useful when an oscillation circuit is constituted by combining the amplification circuit with an oscillator (e.g., a quartz oscillator, a ceramic oscillator).

2. Description of the Related Art

A conventional oscillation circuit which is constituted by combining an amplification circuit with an oscillator, is disclosed in, for example, Japanese Laid-Open Patent Publication: HEI02-010869, published on Jan. 16, 1990, and Japanese Laid-Open Patent Publication: HEI05-267935, published on Oct. 15, 1993. Such a conventional oscillation circuit includes a first inverter circuit, a feedback resistor which is parallel connected to the first inverter circuit, a second inverter circuit which adjusts a waveform of an output signal of the first inverter circuit, and an oscillator which is connected in parallel to the first inverter circuit.

The first and second inverters consist of, for example, a complementary MOS circuit (CMOS circuit) which includes a P-channel gate element serially connecting to an N-channel gate element. Such gate elements consist of, for example, a MOS type field effect transistor. The first inverter receives a pulse signal from an oscillator, and compares the received pulse signal with a threshold voltage Vt1 of the first inverter, and then outputs an alternating signal which alternately changes amplitude between plus and minus on the basis of the threshold voltage Vt1. The second inverter compares the alternating signal with a threshold voltage Vt2 of the second inverter and shapes the alternating signal to have a rectangular pulse waveform.

A gate length L and a gate width W of the gate element of the first and second inverters are designed so that the first and second inverters have desired electrical properties. And, a pattern size of the first inverter is different from that of the second inverter. The threshold voltages Vt1 and Vt2 of the first and second inverters are decided on the basis of dimensions of the P type and N type gate elements of the first and second inverters, respectively. Specifically, the threshold voltages Vt1 and Vt2 are decided on the basis of a ratio (a dimension ratio) between the dimension of the P type gate element and that of the N type gate element.

Such dimension is indicated as W/L, whereby L and W denote the gate length and gate width of a transistor, respectively. Similarly, the above mentioned dimension ratio is indicated as Wp/Lp:Wn/Ln, whereby Lp and Wp respectively denote the gate length and gate width of the PMOS transistor, and Ln and Wn respectively denote the gate length and gate width of the NMOS transistor.

In this specification, a MOS transistor is used as the gate element. And, specifically, while the gate length L of the MOS transistor is a length between source and drain regions of the MOS transistor, in this specification, the gate length L of the MOS transistor is explained as a length of a gate electrode along a channel region between the source and drain regions of the MOS transistor.

When the gate element is a MOS transistor having an offset structure, the gate length L of the MOS transistor is equal to a length between source and drain regions of the MOS transistor. And, when the gate element is a MIS transistor, the gate length L of the MIS transistor is equal to a length between source and drain electrodes of the MIS transistor.

When a gap exists or there is a difference between the threshold voltages Vt1 and Vt2 of the first and second inverters, a pulse width of the amplified pulse signal waveform is different from a pulse separation of the amplified pulse signal waveform. As a result, a distortion of the amplified pulse signal occurs. The P type and N type gate elements of the first and second inverters are designed in consideration of the dimensions (Wp/Lp and Wn/Ln) of the gate elements.

However, when the gate electrode of the first inverter extends along a direction which is different from an extending direction of the gate electrode of the second inverter, the gate length and/or the gate width of the gate element of each of the inverters varies, due to expansion and contraction of a semiconductor substrate which occurs because of warping of the semiconductor substrate. Such a variation of one of the inverters in the warp direction of the semiconductor substrate varies the dimensions (Wp/Lp and Wn/Ln). Specifically, since the dimension ratio (Wp/Lp Wn/Ln) of the first and second inverters varies, the threshold voltages Vt1 and Vt2 reciprocally vary. Similarly, such variation also occurs, due to a difference between coefficients of linear thermal expansion of the first and second inverters in response to a crystal orientation of the semiconductor substrate.

And, when the gate length and the gate width of the gate elements of the first inverter are different from those of the second inverter, even if the variation of the dimension of the first inverter is equal to that of the second inverter, the dimension ratio (Wp/Lp:Wn/Ln) between the first and second inverters varies. Such a variation of the dimension ratio (Wp/Lp:Wn/Ln) between the first and second inverters is called to a dimension gap.

The electrical properties of the amplification circuit and the oscillation circuit having the amplification circuit degrades, due to a gap between the threshold voltages Vt1 and Vt2 of the first and second inverters corresponding to the above mentioned dimension gap between the first and second inverters. As a result, the ability of the power supply to provide power without noise is reduced.

SUMMARY OF THE INVENTION

In an amplification circuit according to the present invention, a first inverter having a plurality of first gate elements which are formed in a first active region, and an input terminal and an output terminal connected to a feedback resistor, wherein first gate electrodes of the first gate elements extend in a first direction; and a second inverter having a plurality of second gate elements which are formed in a second active region, wherein the second inverter receives an output signal from the first inverter and adjusts a waveform of the output signal, wherein second gate electrodes of the second gate elements extend in the first direction. A gate length of the first gate electrodes is the same as a gate length of the second gate electrodes, and a gate width of the first gate electrodes which is defined by the first active region, is the same as a gate width of the second gate electrodes which is defined by the second active region.

In an oscillation circuit according to the present invention, a first inverter having a plurality of first gate elements which are formed in a first active region, and an input terminal and an output terminal connecting to a feedback resistor and an oscillator, wherein first gate electrodes of the first elements extend to a first direction; and a second inverter having a plurality of second gate elements which are formed in a second active region, wherein the second inverter receives an output signal from the first inverter and adjusts a waveform of the output signal, wherein second gate electrodes of the second gate elements extend to the first direction. A gate length of the first gate electrodes is the same as that of the second gate electrodes, and a gate width of the first gate electrodes which is denoted by the first active region, is the same as that of the second gate electrodes which is denoted by the second active region.

The present invention can inhibit occurrence of a gap, or a difference between the theoretical threshold voltage of the first and second inverters, which causes the noise. More further, the present invention can reduce the standby current.

The above and further objects and novel features of the invention will become more fully apparent from the following detailed description, appended claims and accompanying drawings herein.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Preferred embodiments of the present invention will hereinafter be described in detail with reference to the accompanying drawings. The drawings used for this description typically illustrate major characteristic parts to facilitate understanding of the invention.

Figure 1:
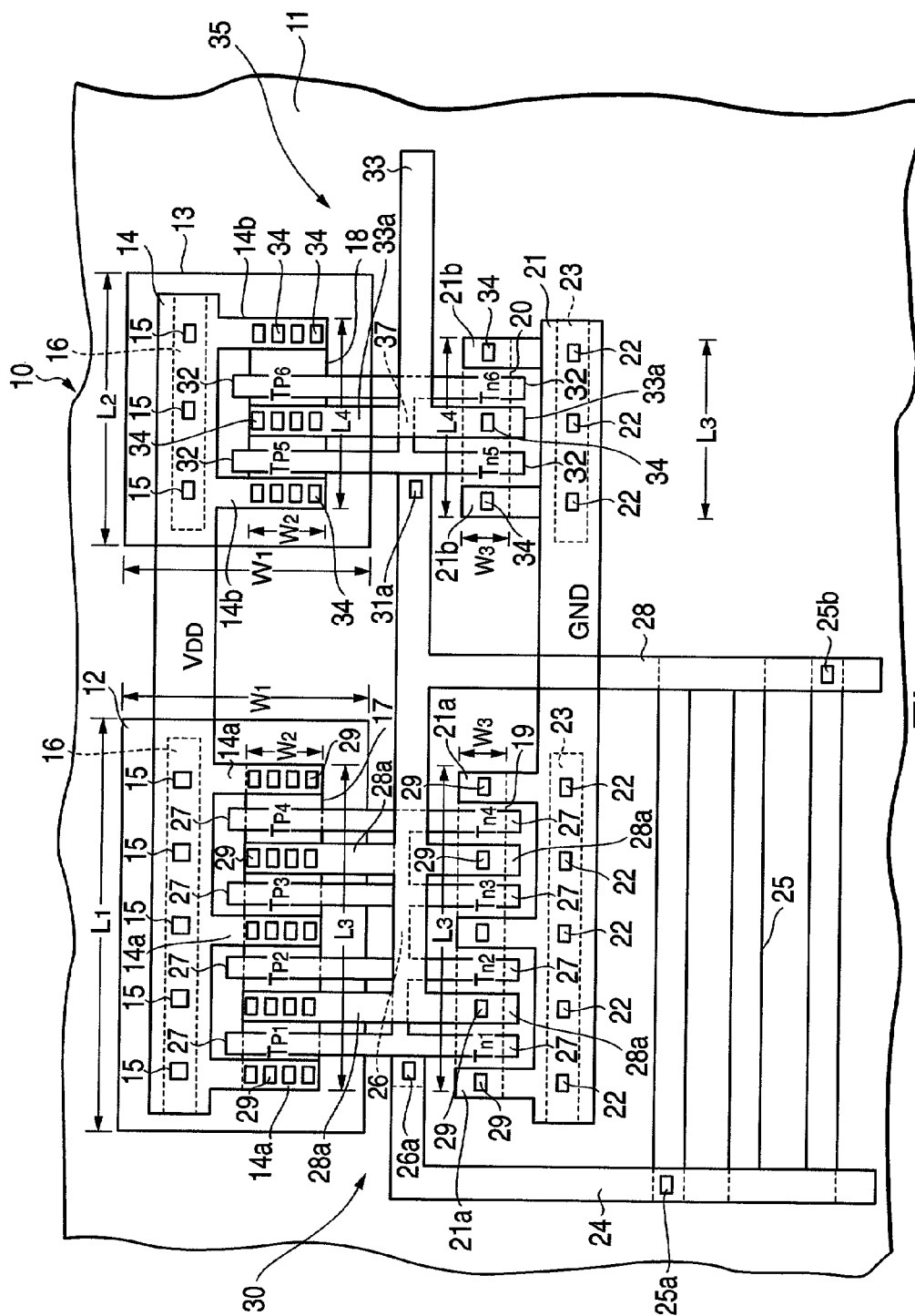
FIG. 1 is a plan view of an amplification circuit according to a first preferred embodiment of the present invention.

FIG. 1 is a plan view of an amplification circuit 10 according to a first preferred embodiment of the present invention. The amplification circuit 10 is formed on a semiconductor substrate 11, for example, a P type silicon substrate. The semiconductor substrate 11 includes impurity regions 12 and 13 which have a rectangular structure and indicate an N type active region. A vertical width W1 of the impurity regions 12 and 13 is the same. A horizontal length L1 of the impurity region 12 is longer than a horizontal length L2 of the impurity region 13.

A power line (e.g., an aluminum wiring) 14 supplying a power supply voltage Vdd horizontally extends over the impurity regions 12 and 13. The power line 14 has source electrode regions 14a which extend over an active region 17, and source electrode regions 14b which extends over an active region 18. The power supply voltage Vdd is, for example, 5.0 V. The power line 14 is formed as a first metal wiring, and is electrically connected to N type highly doped impurity regions 16 which are formed in the impurity regions 12 and 13 for an ohmic contact, through contact holes 15. The impurity regions 12 and 13 can be formed as one impurity region.

Active regions 17 and 18 having a rectangular structure which extend parallel with the power line 14, are formed in the impurity regions 12 and 13, respectively. The active regions 17 and 18 are surrounded by a field isolating region. A MOS transistor as a gate element, is formed in the active regions 17 and 18. The active regions 17 and 18 include a P type impurity region which is source and drain regions of a PMOS transistor, and an N type region which is a channel region between the source and drain regions and is the same conductive type as the impurity regions 12 and 13. A vertical width W2 of the active regions 17 and 18 is the same, however, a horizontal length L3 of the active region 17 is longer than a horizontal length L4 of the active region 18. The horizontal length of the active regions 17 and 18 are properly selectable, in accordance with a number of gate electrodes which are formed on the active regions 17 and 18.

Active region 19 and 20 having a rectangular structure which are spaced from the active regions 17 and 18, are formed in the semiconductor substrate 11. The active regions 19 and 20 are surrounded by the field isolating region. A MOS transistor as a gate element, is formed in the active regions 19 and 20. The active regions 19 and 20 include a N type impurity region which is source and drain regions of an NMOS transistor, and a P type region which is a channel region between the source and drain regions and is the same conductive type as the semiconductor substrate 11. A vertical width W3 of the active region 19 and 20 is the same. A horizontal length L3 of the active region 19 is the same as that of the active region 17, and a horizontal length L4 of the active region 20 is the same as that of the active region 18. The horizontal length of the active regions 17 and 18 are properly selectable, in accordance with a number of gate electrodes which are formed on the active regions 17 and 18.

A power line (e.g., an aluminum wiring) 21 supplying a ground voltage GND horizontally extends along the active regions 19 and 20. The power line 21 has source electrode regions 21a which extend over the active region 19. The power line 21 is formed as the first metal wiring, and is electrically connected to a P type highly doped impurity region 23 which is formed in the semiconductor substrate 11 for an ohmic contact, through contact holes 22. As a result, the power line 21 is electrically connected to the semiconductor substrate 11.

A input power line (e.g., an aluminum wiring) 24 is formed in the semiconductor substrate 11 as the first metal wiring. The input power line 24 extends to between the active regions 17 and 19. The input power line 24 is electrically connected to one end of a feedback resistor (e.g., a poly-silicon) 25 through a contact hole 25a. The gate electrodes 27 cross over the active regions 17 and 19. The other end of the input power line 24 is electrically connected to a wiring 26 which is integrally formed with gate electrodes 27, through a contact hole 26a.

The gate electrodes 27 have the same gate width. In the first preferred embodiment, four regularly spaced gate electrodes 27 cross over the active regions 17 and 19, along a vertical direction W of the active regions 17 and 19. Source and drain regions are formed at both sides of the gate electrodes 27 in the active regions 17 and 19.

A wiring (e.g., an aluminum wiring) 28 is formed as a second metal wiring, and is electrically connected to the other end of the feedback resistor 25 through a contact hole 25b. The wiring 28 extends to between the active regions 17 and 19. The wiring 28 is electrically isolated from the wiring 26, due to an isolating layer. The wiring 28 has a region which extends between and along the active regions 17 and 19, and drain electrode regions 28a which extend over the active regions 17 and 19. The drain electrode regions 28a are electrically connected to the drain regions located in the active region 17, through contact holes 29. On the other hand, the power line 14 has the source electrode regions 14a which extend over the active region 17. The source electrode regions 14a are electrically connected to the source region located in the active region 17, through the contact holes 29. The source electrode regions 14a and the drain electrode regions 28a are alternately located in a horizontal direction. And, one of the gate electrodes 27 is located between one of the source electrode regions 14a and one of the drain electrode regions 28a.

Similarly, the drain electrode regions 28a are electrically connected to the drain regions located in the active region 19, through contact holes 29. On the other hand, the power line 21 has the source electrode regions 21a which extend over the active region 19. The source electrode regions 21a are electrically connected to the source regions located in the active region 19, through the contact holes 29. The source and drain electrode regions 21a and 28a are alternately located in a horizontally direction. And, one of the gate electrodes 27 is located between one of the source electrode regions 14a and one of the drain electrode regions 28a.

As a result, PMOS transistor Tp1 through Tp4 which have a gate length Lp and a gate width W2, respectively, are formed in the active region 17 of the semiconductor substrate 11. The gate length Lp indicates a horizontal length of the gate electrodes 27, and the gate width W2 indicates a vertical width of the gate electrodes 27. And, the source electrode regions 14a and the drain electrode regions 28a of the PMOS transistors Tp1 through Tp4 are electrically connected to the power line 14 and the wiring 28. Specifically, the PMOS transistors Tp1 through Tp4 are electrically connected each other, through the power line 14 and the wiring 28.

Similarly, NMOS transistor Tn1 through Tn4 which have a gate length Ln and a gate width W3 respectively, are formed in the active region 19 of the semiconductor substrate 11. The gate length Ln indicates a horizontal length of the gate electrodes 27, and the gate width W3 indicates a vertical width of the gate electrodes 27. And, the source and drain electrodes 21a and 28a of the NMOS transistors Tn1 through Tn4 are electrically connected to the power line (GND) 21 and the wiring 28. Specifically, the NMOS transistors Tn1 through Tn4 are electrically connected each other, through the power line (GND) 21 and the wiring 28.

The drain regions of the PMOS transistors Tp1 through Tp4 are electrically connected to the drain regions of the NMOS transistors Tn1 through Tn4, through the wiring 28. And, the gate electrodes 27 of the PMOS transistors Tp1 through Tp4 and the NMOS transistors Tn1 through Tn4 are electrically connected to each other, through the wiring 26. Therefore, CMOS circuit 30 operating as a first inverter consists of the PMOS transistors Tp1 through Tp4 and the NMOS transistors Tn1 through Tn4.

The wiring 28 is electrically connected to a wiring 31 which is integrally formed with gate electrodes 32, through a contact hole 31a. In the first preferred embodiment, four regularly spaced gate electrodes 32 cross over the active regions 18 and 20, along a vertical direction W of the active regions 18 and 20. Source and drain regions are formed at both sides of the gate electrodes 32 in the active regions 18 and 20.

A width of overlap portion of the gate electrode 27 and the active region 17 which indicates a gate width of the PMOS transistor Tp and the vertical width W2 of the active region 17, is equal to a width of overlap portion of the gate electrode 32 and the active region 18 which indicates a gate width of the PMOS transistor Tp and the vertical width W2 of the active region 18. And, a width of overlap portion of the gate electrode 27 and the active region 19 which indicates a gate width of the NMOS transistor Tn and the vertical width W3 of the active region 19, is equal to a width of overlap portion of the gate electrode 32 and the active region 20 which indicates a gate width of the NMOS transistor Tn and the vertical width W3 of the active region 20. However, a width of non overlap portion of the gate electrode 27 and the active regions 17 and 19 which is located on the field insulating region, is properly selectable. Similarly, a width of non overlap portion of the gate electrode 32 and the active regions 18 and 20 which is located on the field insulating region, is properly selectable.

A output power line (e.g., an aluminum wiring) 33 is formed between the active regions 18 and 20 in the semiconductor substrate 11 as the first metal wiring. The output power line 33 has a drain electrode region 33a which extends over the active regions 18 and 20. The drain electrode region 33a is electrically connected to the drain region of the active region 18 through contact holes 34. On the other hand, the power line 14 has the source electrode regions 14b which extend over the active region 19. The source electrode regions 14b are electrically connected to the source regions located in the active region 17, through the contact holes 34. The source electrode regions 14b and the drain electrode region 33a are alternately located in a horizontal direction. And, one of the gate electrodes 32 is located between one of the source electrode regions 14b and the drain electrode region 33a.

Since the vertical width W2 of the active regions 17 and 18 is the same, a vertical width of the source electrode regions 14b which are formed in the active region 18 is the same as the vertical width of the source electrode regions 14a which are formed in the active region 17, and a vertical width of the drain electrode region 33a which is formed in the active region 18 is the same as the vertical width of the drain electrode regions 28a which are formed in the active region 17. Therefore, PMOS transistors Tp5 and Tp6 having a gate width which is equal to the gate width of the PMOS transistors Tp1 through Tp4, are formed. The PMOS transistors Tp5 and Tp6 include the source electrode regions 14b which are electrically connected to each other through the power line 14, and the common drain electrode region 33a which is electrically connected to the output power line 33. As a result, the PMOS transistors Tp5 and Tp6 are electrically connected to each other in parallel.

The drain electrode region 33a is electrically connected to the drain region located in the active region 20, through contact holes 34. On the other hand, the power line 21 has the source electrode regions 21b which extend over the active region 20. The source electrode regions 21b are electrically connected to the source regions located in the active region 20, through the contact holes 34. The source and drain electrode regions 21b and 33a are alternately located in a horizontal direction. And, one of the gate electrodes 32 is located between one of the source electrode regions 21b and the drain electrode region 33a.

Since the vertical width W3 of the active regions 19 and 20 are the same, a vertical width of the source electrode regions 21b which are formed in the active region 20 are the same as the vertical width of the source electrode regions 21a which are formed in the active region 19, and a vertical width of the drain electrode region 33a which is formed in the active region 20 is the same as the vertical width of the drain electrode regions 28a which are formed in the active region 19. Therefore, NMOS transistors Tn5 and Tn6 having a gate width which is equal to the gate width of the NMOS transistors Tn1 through Tn4, are formed. The NMOS transistors Tn5 and Tn6 include the source electrode regions 21b which are electrically connected to each other through the power line 21, the common drain electrode region 33a which is electrically connected to the output power line 33. As a result, the NMOS transistors Tn5 and Tn6 are electrically connected in parallel to each other.

The common drain electrode region 33a of the PMOS transistors Tp5 and Tp6 is electrically connected to the common drain electrode region 33a of the NMOS transistors Tn5 and Tn6, through the output power line 33. And, the gate electrodes 32 of the PMOS transistors Tp5 and Tp6 are electrically connected to those of the NMOS transistors Tn5 and Tn6, respectively, through the wiring 31. Therefore, CMOS circuit 35 operating as a second inverter consists of the PMOS transistors Tp5 and Tp6 and the NMOS transistors Tn5 and Tn6.

Figure 2:
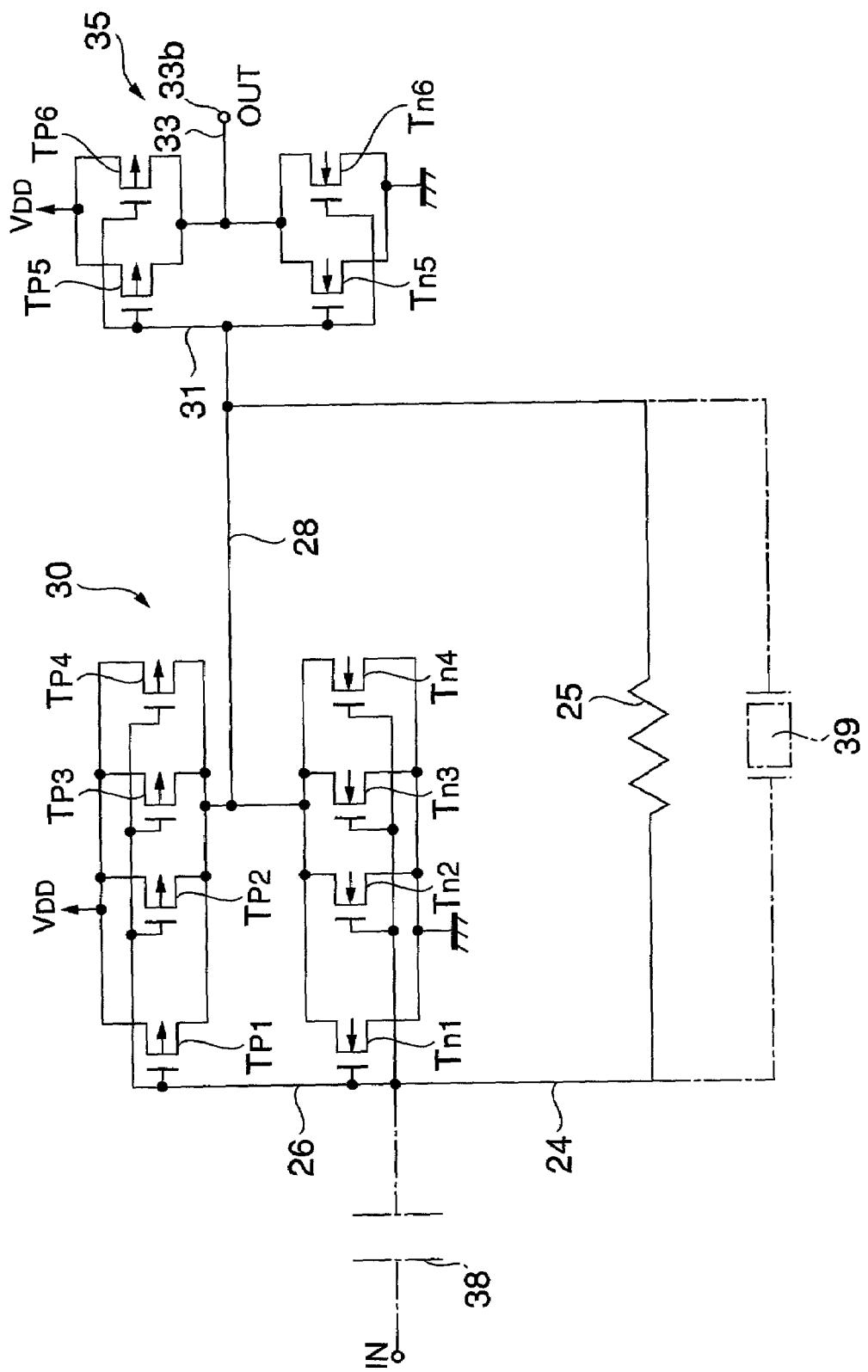
FIG. 2 is an equivalent circuit diagram of the amplification circuit of the first preferred embodiment of the present invention.

FIG. 2 is an equivalent circuit diagram of the amplification circuit 10 as shown in FIG. 1. As shown in FIG. 2, gate electrodes of the PMOS transistors Tp1 through Tp4 are electrically connected to the input power line 24, and the PMOS transistors Tp1 through Tp4 are electrically connected in parallel to each other. And, the PMOS transistors Tp1 through Tp4 have the same gate width Wp and the same gate length Lp. Therefore, the PMOS transistors Tp1 through Tp4 operate as one PMOS transistor having a gate length Lp and a gate width 4Wp which is four times the gate width Wp of the PMOS transistors Tp1 through Tp4.

Similarly, as shown in FIG. 2, gate electrodes of the NMOS transistors Tn1 through Tn4 are electrically connected to the input power line 24, and the NMOS transistors Tn1 through Tn4 are electrically connected in parallel to each other. And, the NMOS transistors Tn1 through Tn4 have the same gate width Wn and the same gate length Ln. Therefore, the NMOS transistors Tn1 through Tn4 operate as one NMOS transistor having a gate length Ln and a gate width 4Wn which is four times the gate width Wn of the NMOS transistors Tn1 through Tn4. The first inverter 30 consists of these PMOS and NMOS transistors.

Since the gate length Lp of the PMOS transistors Tp1 through Tp4 is the same as the gate length Ln of the NMOS transistors Tn1 through Tn4, a theoretical threshold voltage Vth of the first inverter 30 is decided on the basis of a dimension ratio between the dimension of the PMOS transistor and that of the NMOS transistor, specifically, on the basis of a capability ratio Wp/Wn between the PMOS and NMOS transistors. In other words, the theoretical threshold voltage Vth of the first inverter 30 is decided on the basis of a ratio between the vertical width W2 of the active region 17 and the vertical width W3 of the active region 19. And, the theoretical threshold voltage Vth of the first inverter 30 can be set by the vertical width W2 and W3 of the active regions 17 and 19.

On the other hand, as shown in FIG. 2, the PMOS transistor Tp5 is electrically connected in parallel to the PMOS transistor Tp6. And, the PMOS transistors Tp5 and Tp6 have the same gate width Wp and the same gate length Lp. Therefore, the PMOS transistors Tp5 and Tp6 operate as one PMOS transistor having a gate length Lp and a gate width 2Wp which is twice the gate width Wp of the PMOS transistors Tp5 and Tp6. Similarly, the NMOS transistor Tn5 is electrically connected in parallel to the NMOS transistor Tn6. And, the NMOS transistors Tn5 and Tn6 have the same gate width Wn and the same gate length Ln. Therefore, the NMOS transistors Tn5 and Tn6 operate as one NMOS transistor having a gate length Lp and a gate width 2Wp which is twice the gate width Wp of the PMOS transistors Tp5 and Tp6.

Therefore, similarly to the above mentioned first inverter 30, a theoretical threshold voltage Vth of the second inverter 35 is also decided on the basis of a ratio between the vertical width W2 of the active region 18 and the vertical width W3 of the active region 20. Since the vertical width W2 of the active region 18 and the vertical width W3 of the active region 20 are respectively the same as the vertical width W3 of the active region 17 and that of the active region 19, the theoretical threshold voltage Vth of the second inverter 35 is the same as the theoretical threshold voltage Vth of the first inverter 30.

In the first preferred embodiment, since the gate electrodes 27 and 32 of the PMOS and NMOS transistors Tp1 through Tp6 and Tn1 through Tn6 extend to the same direction, the gate width and the gate length of all transistors Tp1 through Tp6 and Tn1 through Tn6 uniformly change when expansion and contraction of the semiconductor substrate 11 occurs. As a result, since variations of the gate width and the gate length due to the expansion and contraction of the semiconductor substrate 11, does not affect the capability ratio Wp/Wn, the theoretical threshold voltage Vth of the first and second inverters 30 and 35 always correspond.

For example, as shown in FIG. 1, when the active regions 17 and 18 have the vertical width W2 and the active regions 19 and 20 have the vertical width W3, the capability ratio of the first inverter 30 is denoted by a following equation (1). Similarly, the capability ratio of the second inverter 35 is denoted by a following equation (2).

$$W2 \times 4/W3 \times 4 \quad (1)$$

$$W2 \times 2/W3 \times 2 \quad (2)$$

Specifically, since the capability ratio of the first and second inverters 30 and 35 is the same (W2/W3), the theoretical threshold voltage of the first and second inverters 30 and 35 is the same (Vth).

While, when the vertical width of the active regions 17, 18, 19 and 20 has, for example, 0.1 μm pitch error, the capability ratio of the first inverter 30 is denoted by a following equation (3), and the capability ratio of the second inverter 35 is denoted by a following equation (4).

$$(W2+0.1) \times 4/(W3+0.1) \times 4 \quad (3)$$

$$(W2+0.1) \times 2/(W3+0.1) \times 2 \quad (4)$$

Specifically, the capability ratio of the first and second inverters 30 and 35 is the same (W2+0.1/W3+0.1) notwithstanding the pitch error. Therefore, the theoretical threshold voltage of the first and second inverters 30 and 35 is the same (Vth) notwithstanding the pitch error.

On the other hand, in a conventional amplification circuit having the first and second inverters consist of the gate width 4×W2 of the PMOS transistor and the gate width 2×W3 of the NMOS transistor, the capability ratio of the first and second inverters is the same (Vth). However, when the vertical width of the active regions in the conventional amplification circuit that correspond to the active regions in the first preferred embodiment has, for example, 0.1 µm pitch error, the capability ratio of the first inverter 30 is denoted by a following equation (5), and the capability ratio of the second inverter 35 is denotes by a following equation (6). Specifically, the theoretical threshold voltage of the first inverter 30 is different from that of the second inverter 35.

$$(4\times W2+0.1)/(4\times W3+0.1) \quad (5)$$

$$(2\times W2+0.1)/(2\times W3+0.1) \quad (6)$$

According to the amplification circuit 10 of the invention, since the first inverter 30 consists of the PMOS transistors Tp1 through Tp4 and the NMOS transistors Tn1 through Tn4, and the second inverter 35 consists of the PMOS transistors Tp5 and Tp6 and the NMOS transistors Tn5 and Tn6, the theoretical threshold voltage Vth of the first and second inverters 30 and 35 can correspond even if the pitch error occurs. And, since the first and second inverters 30 and 35 use the same power lines 14 and 21, the influence of noise on the amplification circuit 10 is compensated. Therefore, the existence of a gap or a difference between the theoretical threshold voltages of the first and second inverters 30 and 35 which causes the noise, can be inhibited.

As shown by dashed line in FIG. 2, an infinitesimal amplitude signal (e.g., a clock pulse) is applied to the amplification circuit 10 through a coupling condenser 38. As a result, the amplification circuit 10 can amplify the infinitesimal amplitude signal and output it from an output terminal 33b of the output power line 33.

An amplitude of the clock pulse is for example 300 mV, specifically a peak to bottom amplitude is 300 mV. Since an amplitude of an output signal of the first inverter 30 is 5.0 V, such a 300 mV amplitude of the clock pulse is very small. Therefore, such a clock pulse is considered as an infinitesimal amplitude signal. The coupling condenser 38 cuts a direct current portion (a middle voltage level of the amplitude) of the infinitesimal amplitude signal. Therefore, the infinitesimal amplitude signal whose middle voltage level of amplitude is the theoretical threshold voltage Vth, is applied to the input power line 24.

The first inverter 30 receives the infinitesimal amplitude signal, and compares the received infinitesimal amplitude signal with the theoretical threshold voltage Vth of the first inverter 30, and then outputs the alternating signal which alternately changes amplitude between plus and minus on the basis of the theoretical threshold voltage Vth. The second inverter 35 compares the alternating signal with the theoretical threshold voltage Vth of the second inverter 35 and forms an alternate signal having a rectangular pulse waveform. And, the second inverter 35 outputs a clock pulse which has 0 V through 5.0 V amplitude. Specifically, the clock pulse having 300 mV amplitude is amplified to the clock pulse having about 5.0 V amplitude.

According to the first preferred embodiment of the present invention, since the theoretical threshold voltage Vth of the first and second inverters 30 and 35 can be made to correspond, good amplification can be achieved.

While the first preferred embodiment of the present invention presents an example in which the coupling condenser 38 is connected to the amplification circuit 10, the present invention is not limited to this example, and an oscillator 39 (e.g., a quartz oscillator) may be parallel connected to the first inverter 30. As a result, an oscillation circuit is formed. Specifically, the oscillation circuit can output a clock pulse having a reasonable rectangular pulse waveform.

Figure 3:
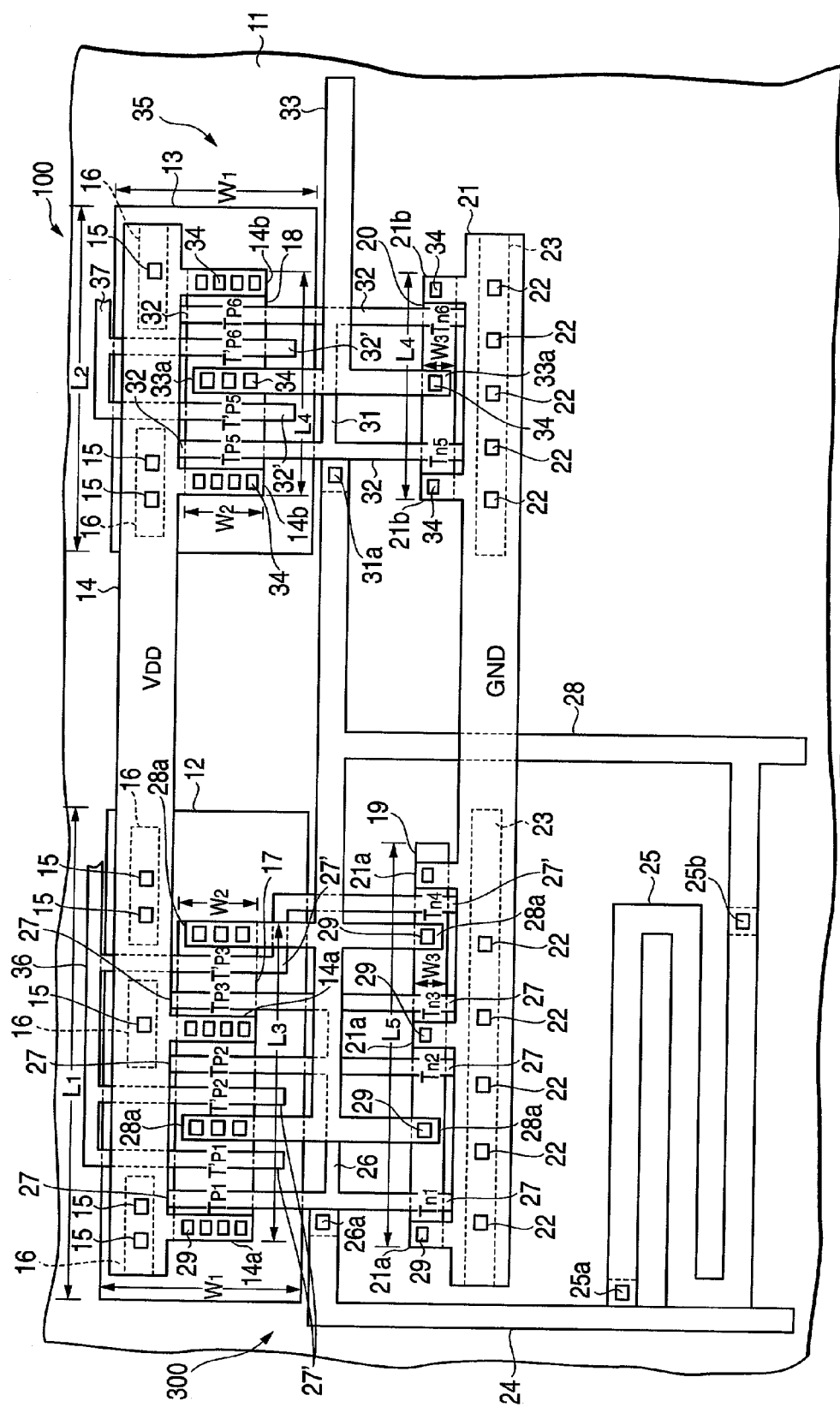
FIG. 3 is a plan view of an amplification circuit according to a second preferred embodiment of the present invention.

FIG. 3 is a plan view of an amplification circuit 100 according to a second preferred embodiment of the present invention. Specifically, in the second preferred embodiment, the amplification circuit 100 has a first inverter 300 consisting of a NOR logic circuit 300.

A wiring 26 has three gate electrode regions 27. One end of the three gate electrode regions 27 extends over active region 17, and the other end of the three gate electrode regions 27 extend over an active region 19. As a result, three PMOS transistors Tp1 through Tp3 which are electrically connected in parallel to each other, are formed in the active region 17. And, three NMOS transistors Tn1 through Tn3 which are electrically connected in parallel to each other, are formed in the active region 19. Three gate electrodes 27' which have the same gate width as the gate width of the gate electrode regions 27, extend in parallel between the gate electrode regions 27 and drain electrodes 28a, respectively. One of the gate electrodes 27' is formed in the active region 17, and extends in parallel between one of the drain electrodes 28a and one of source electrodes 21a in the active region 19.

PMOS transistors T'p1 through T'p3 having gate electrodes 27' which extend over the active region 17 are formed. Since the PMOS transistors T'p1 through T'p3 share source and drain regions with the PMOS transistors Tp1 through Tp3, the PMOS transistors Tp1 through Tp3 are serially and electrically connected to the PMOS transistors T'p1 through T'p3. On the other hand, NMOS transistor Tn4 having one of the gate electrodes 27' which extends over the active region 19 is formed. The NMOS transistor Tn4 is parallel and electrically connected to the NMOS transistors Tn1 through Tn3.

Figure 4:
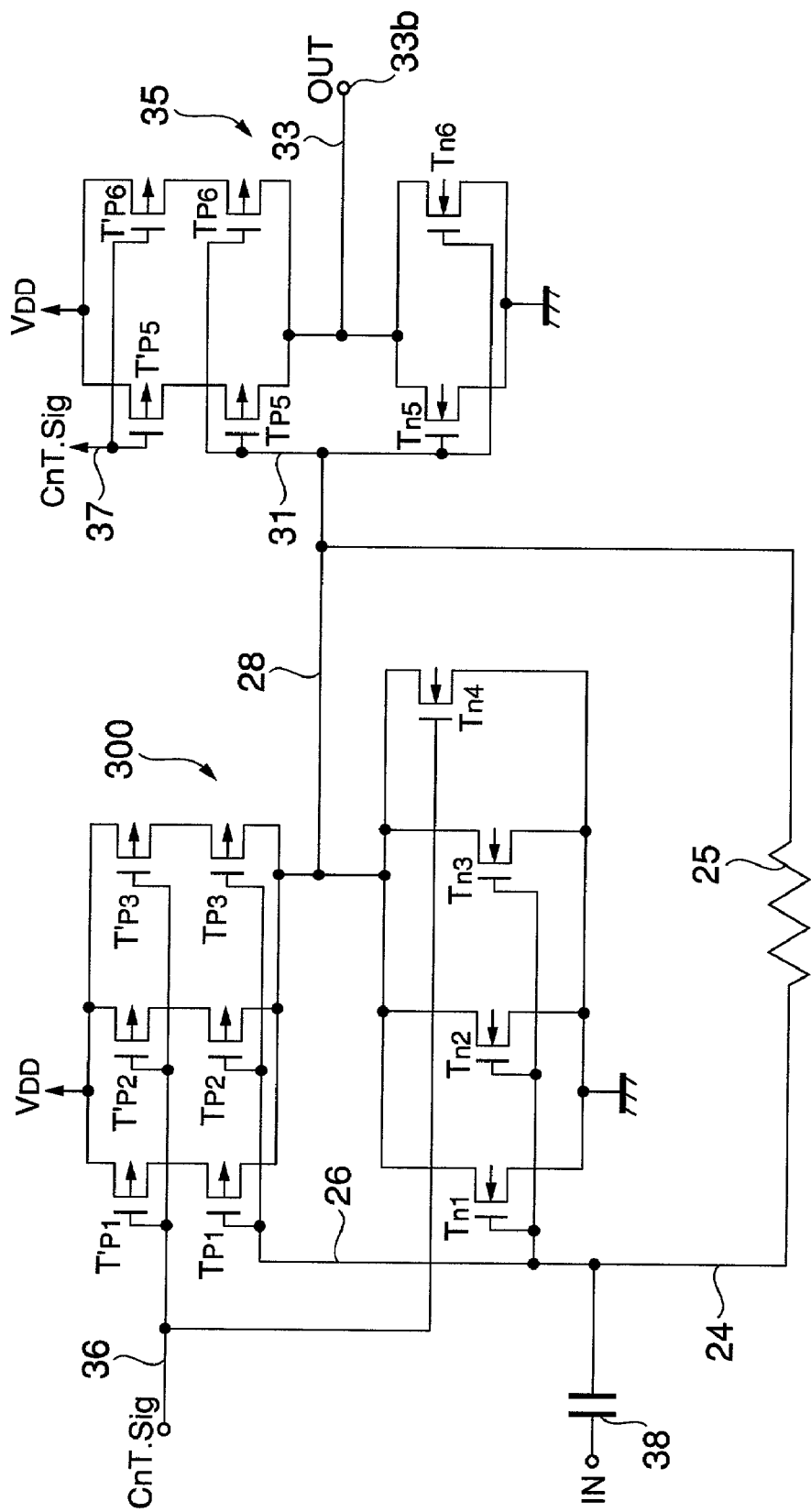
FIG. 4 is an equivalent circuit diagram of the amplification circuit of the second preferred embodiment of the present invention.

FIG. 4 is an equivalent circuit diagram of the amplification circuit 100 as shown in FIG. 3. As shown in FIG. 4, the PMOS transistors Tp1 through Tp3 and T'p1 through T'p3 are serially and electrically connected to the NMOS transistors Tn1 through Tn3 and Tn4 through a wiring 28. As a result, the NOR logic circuit 300 consists of the PMOS transistors Tp1 through Tp3 and T'p1 through T'p3 and the NMOS transistors Tn1 through Tn3 and Tn4.

The gate electrode 27' of the NMOS transistor Tn4 extending over the active region 19 is integrally formed with the gate electrode 27' of the PMOS transistor T'p3 extending over the active region 17. Since all the gate electrodes 27' are electrically connected to a control line 36 which extends in parallel with the power line 14, all the gate electrodes 27' receive a high level signal having a positive voltage when the amplification circuit 100 is an inactive, and receive a low level signal having, for example, a zero voltage when the amplification circuit 100 is active.

In the PMOS transistors Tp1 through Tp3 and the NMOS transistors Tn1 through Tn3, an input signal (e.g., an infinitesimal amplitude signal) is applied to the input power line 24 through the coupling condenser 38, and then the input signal is applied to each of gate electrodes 27 of the transistors Tp1 through Tp3 and Tn1 through Tn3, through the wiring 26. On the other hand, each gate electrodes 27' of the PMOS transistors T'p1 through T'p3 and the NMOS transistor Tn4 selectively receive the high level signal or the low level signal through the control line 36.

A wiring 31 has two gate electrode regions 32. The gate electrodes 32 extend over an active region 18 which have the same vertical width W2 as the vertical width W2 of the active region 17. As a result, two PMOS transistors Tp5 and Tp6 which are electrically connected in parallel to each other, are formed in the active region 18. And, two NMOS transistors Tn5 and Tn6 are formed in the active region 20. Two gate electrodes 32' which have the same gate width as the gate width of the gate electrodes 32, extend in parallel between the gate electrodes 32 and a drain electrode 33a, respectively.

Since the PMOS transistors T'p5 and T'p6 share source and drain regions with the PMOS transistors Tp5 and Tp6, the PMOS transistors T'p5 and T'p6 are serially and electrically connected to the PMOS transistors Tp5 and Tp6.

Since the gate electrodes 32' are electrically connected to a control line 37 which extends in parallel with the power line 14, the gate electrodes 32' receive a high level signal having a positive voltage when the amplification circuit 100 is inactive, and receive a low level signal having, for example, a zero voltage when the amplification circuit 100 is active.

The NMOS transistors Tn5 and Tn6 are formed in the active region 20. The active region 20 has the same horizontal length L4 as the active region 18, and has the same vertical width W3 as the active region 19.

Each of gate electrodes 32 of the PMOS transistors Tp5 and Tp6 and the NMOS transistors Tn5 and Tn6 receive a signal which passes through the wiring 31. On the other hand, each of gate electrodes 32' of the PMOS transistors T'p5 through T'p6 selectively receive the high level signal or the low level signal through the control line 37.

As shown in FIG. 4, a high level signal is applied to the control lines 36 and 37 when the amplification circuit 100 is inactive, and a low level signal is applied to the control lines 36 and 37 when the amplification circuit 100 is active. As a result, when the amplification circuit 100 is active, the PMOS transistors T'p1 through T'p3, T'p5 through T'p6 are in the "ON" state, and the NMOS transistor Tn4 is in the "OFF" state.

Each path between the source and drain of the PMOS transistors T'p1 through T'p3, T'p5 and T'p6 are shortened, when the PMOS transistors T'p1 through T'p3, T'p5 and T'p6 are in the "ON" state. Therefore, the PMOS transistors Tp1 through Tp3 and T'p1 through T'p3 which are formed in the active region 17, substantially operate as a group of the PMOS transistors Tp1 through Tp3 which are parallel and electrically connected to each other. And, the PMOS transistors Tp5, Tp6, T'p5 and T'p6 which are formed in the active region 18, substantially operate as a group of the PMOS transistors Tp5 and Tp6 which are electrically connected in parallel to each other. On the other hand, when a low level is applied to control line 36, the NMOS transistor Tn4 is shut off, when the NMOS transistor Tn4 is "OFF" state.

Since the low level signal is applied to the control lines 36 and 37 when the amplification circuit 100 is active, the NOR logic circuit 300 substantially operates as a CMOS logic circuit consisted of the PMOS transistors Tp1 through Tp3 and the NMOS transistors Tn1 through Tn3. Similarly, the logic circuit 35 operate as a CMOS logic circuit. Therefore, the amplification circuit 100 of the second preferred embodiment can operate as the first and second inverters 300 and 35.

On the other hand, since the high level signal is applied to the control lines 36 and 37 when the amplification circuit 100 is inactive, the PMOS transistors T'p1 through T'p6 are shut off. Therefore, a standby current of the first and second inverters 30 and 35 can be kept to nearly "0".

Similarly to the first preferred embodiment, since all gate electrodes of the PMOS transistors Tp1 through Tp6 and T'p1 through T'p6 and the NMOS transistors Tn1 through Tn6 are formed to extend in the same direction, the theoretical threshold voltage Vth of the first and second inverters 300 and 35 can correspond even if pitch error occurs.

According to the second preferred embodiment of the present invention, the existence of a gap or a difference between the theoretical threshold voltage of the first and second inverters 300 and 35 which causes the noise, can be inhibited. More further, the standby current can be reduced.

Figure 5:
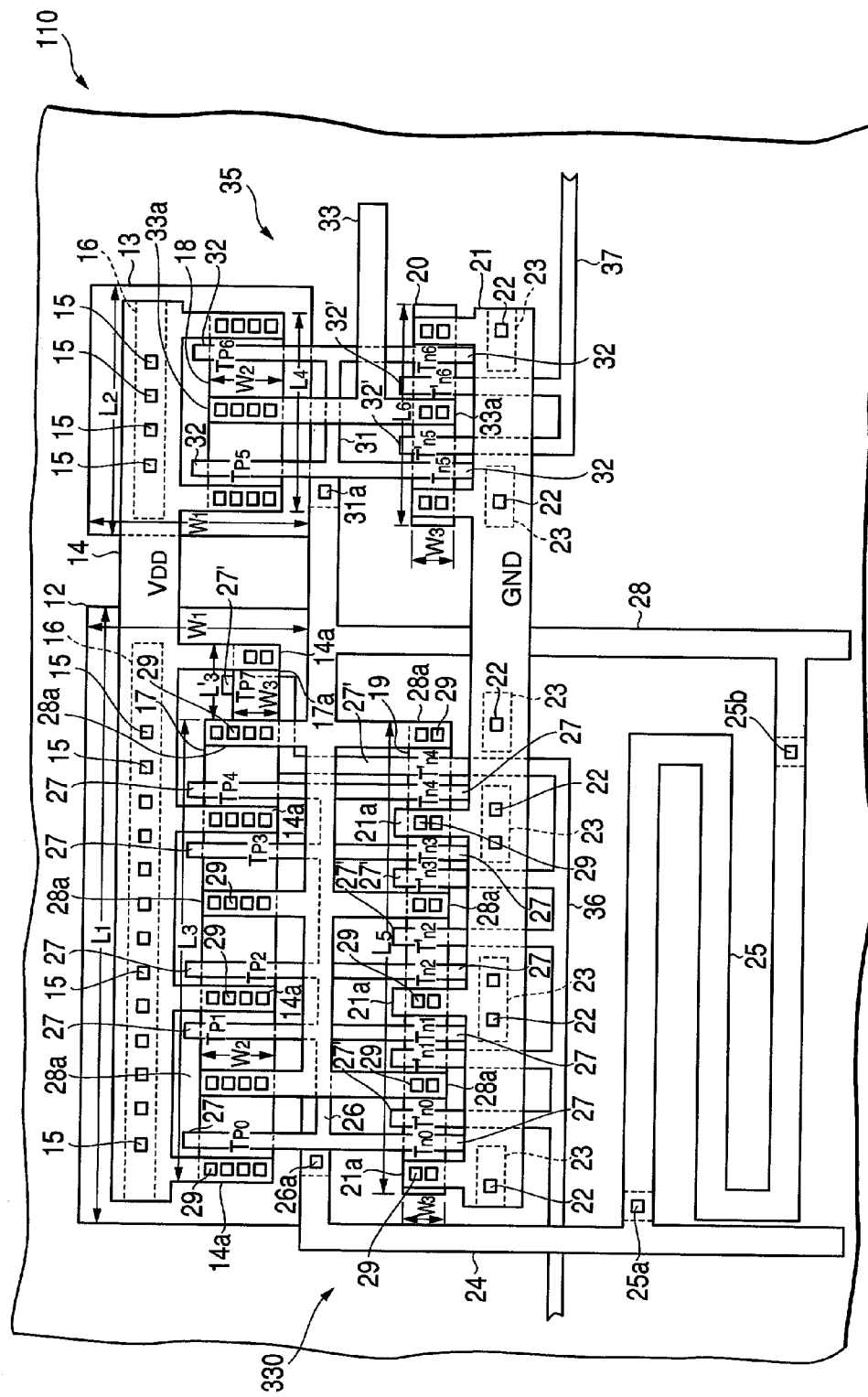
FIG. 5 is a plan view of an amplification circuit according to a third preferred embodiment of the present invention.

FIG. 5 is a plan view of an amplification circuit 110 according to a third preferred embodiment of the present invention. Specifically, in the third preferred embodiment, the amplification circuit 110 has a first inverter 330 which consists of a NAND logic circuit 330.

A wiring 26 has five gate electrode regions 27. One end of the five gate electrode regions 27 extend over an active region 17 which has a vertical width W2, and the other end of the five gate electrode regions 27 extend over an active region 19. As a result, five PMOS transistors Tp0 through Tp4 which are electrically connected in parallel to each other, are formed in the active region 17. And, five NMOS transistors Tn0 through Tn4 which are parallel and electrically connected each other, are formed in the active region 19. An extending region 17a is formed adjacent to one end of the active region 17. A vertical width W3 of the extending region 17a is shorter than the vertical width W2 of the active region 17. The vertical width W3 of the active region 19 is the same as that of the extending region 17a.

Five gate electrodes 27' which have the same gate width as the gate width of the gate electrode regions 27, extend in parallel between the gate electrode regions and drain electrodes 28a, respectively. One of the gate electrode 27' is formed in the extending region 17a, and parallel extend between one of the drain electrode 28a and one of source electrode 14a.

NMOS transistors T'n0 through T'n4 having gate electrodes 27' which extend over the active region 19 are formed. Since the NMOS transistors T'n0 through T'n4 share source and drain regions with the NMOS transistors Tn0 through Tn4, the NMOS transistors Tn0 through Tn4 are serially and electrically connected to the NMOS transistors T'n0 through T'n4. On the other hand, PMOS transistors Tp7 having one of the gate electrodes 27' which extends over the active region 17 is formed. The PMOS transistors Tn7 is parallel and electrically connected to the PMOS transistors Tn0 through Tn4.

Figure 6:
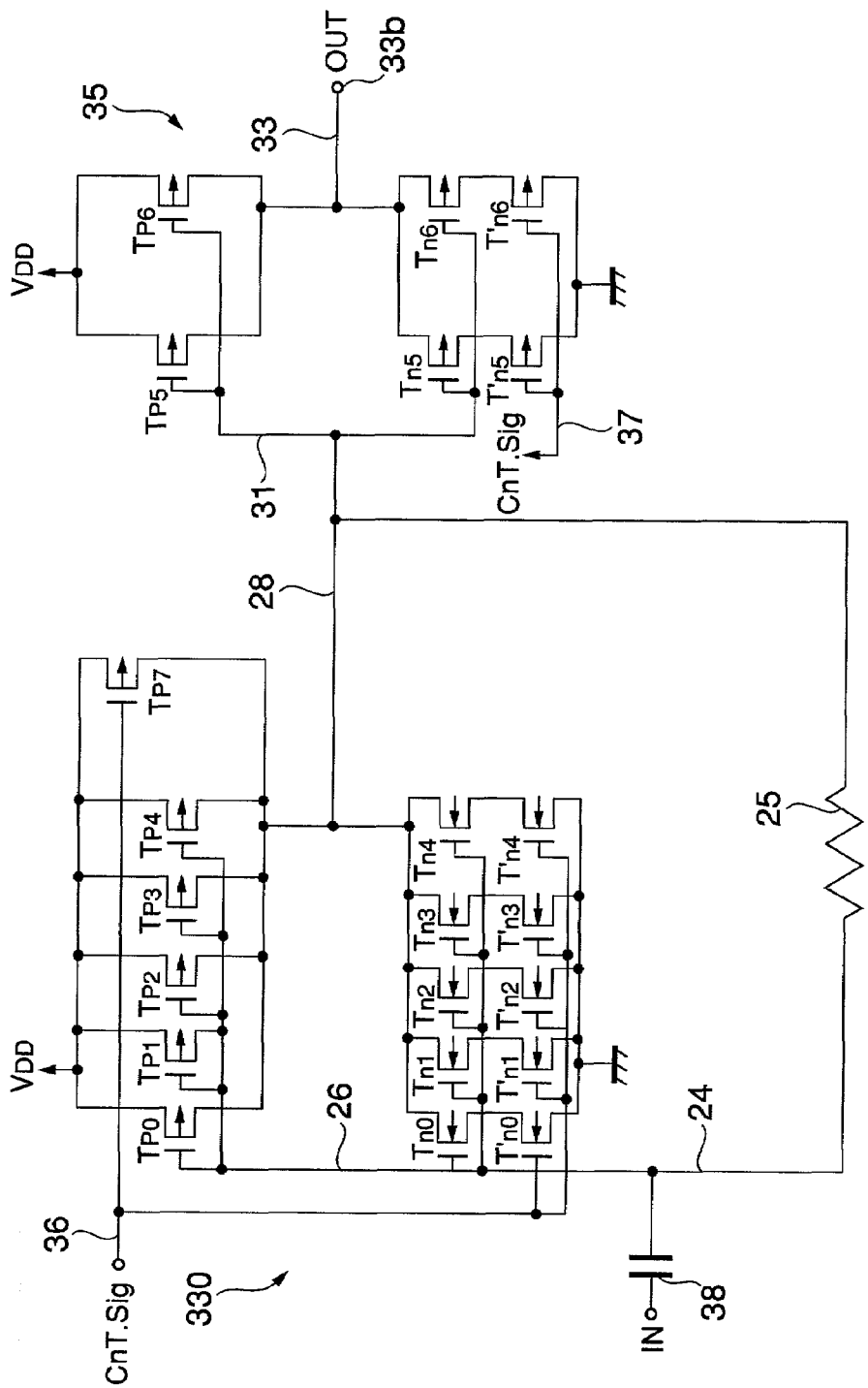
FIG. 6 is an equivalent circuit diagram of the amplification circuit of the third preferred embodiment of the present invention.

FIG. 6 is an equivalent circuit diagram of the amplification circuit 110 as shown in FIG. 5. As shown in FIG. 6, the NMOS transistors Tn0 through Tn4 and T'n0 through T'n4 are serially and electrically connected to the PMOS transistors Tp0 through Tp4 and Tp7 through a wiring 28. As a result, the NAND logic circuit 330 consists of the NMOS transistors Tn0 through Tn4 and T'n0 through T'n4 and the PMOS transistors Tp0 through Tp4 and Tp7.

The gate electrode 27' of the PMOS transistor Tp7 extending over the extending region 17a is integrally formed with the gate electrode 27' of the PMOS transistor T'n4 extending over the active region 19. Since all the gate electrodes 27' are electrically connected to a control line 36 which extends in parallel with the power line 21, all the gate electrodes 27' receive a high level signal having a positive voltage when the amplification circuit 110 is active, and receive a low level signal having, for example, a zero voltage when the amplification circuit 110 is inactive.

In the PMOS transistors Tp0 through Tp4 and the NMOS transistors Tn0 through Tn4, an input signal (e.g., an infinitesimal amplitude signal) is applied to the input power line 24 through the coupling condenser 38, and then the input signal is applied to each of gate electrodes 27 of the transistors Tp0 through Tp4 and Tn0 through Tn4, through the wiring 26. On the other hand, each of gate electrodes 27' of the PMOS transistor Tp7 and the NMOS transistors T'n0 through T'n4 selectively receive the high level signal or the low level signal through the control line 36.

A wiring 31 has two gate electrode regions 32. The gate electrodes 32 extend over the active region 18 which have the same vertical width W2 as the vertical width W2 of the active region 17. As a result, two PMOS transistors Tp5 and Tp6 having the gate electrode 32 are formed in the active region 18. And, the gate electrodes 32 extend over the active region 20 which have the same vertical width W3 as the vertical width W3 of the active region 19. As a result, two NMOS transistors Tn5 and Tn6 having the gate electrode 32 are formed in the active region 20.

The two gate electrodes 32' which have the same gate width as the gate width of the gate electrodes 32, extend in parallel between the gate electrodes 32 and a drain electrode 33a, respectively.

Since the NMOS transistors T'n5 and T'n6 share source and drain regions with the NMOS transistors Tn5 and Tn6, the NMOS transistors T'n5 and T'n6 are serially and electrically connected to the NMOS transistors Tn5 and Tn6.

Since the gate electrodes 32' are electrically connected to a control line 37 which extends in parallel with the power line 21, the gate electrodes 32' receive a high level signal having a positive voltage when the amplification circuit 110 is active, and receive a low level signal, for example, a zero voltage when the amplification circuit 110 is inactive.

As shown in FIG. 6, a high level signal is applied to the control lines 36 and 37 when the amplification circuit 110 is active, and a low level signal is applied to the control lines 36 and 37 when the amplification circuit 110 is inactive. As a result, when the amplification circuit 110 is active, the NMOS transistors T'n0 through T'n4, T'n5 and T'n6 are in the "ON" state, and the PMOS transistor Tp7 is in the "OFF" state.

Each path between the source and drain of the NMOS transistors T'n0 through T'n4, T'n5 and T'n6 are shortened, when the NMOS transistors T'n0 through T'n4, T'n5 and T'n6 are in the "ON" state. Therefore, the NMOS transistors Tn0 through Tn4 and T'n0 through T'n4 which are formed in the active region 19, substantially operate as a group of the NMOS transistors Tn0 through Tn4 which are electrically connected in parallel to each other. And, the NMOS transistors Tn5, Tn6, T'n5 and T'n6 which are formed in the active region 20, substantially operate as a group of the NMOS transistors Tn5 and Tn6 which are electrically connected in parallel to each other. On the other hand, when the high level signal is applied to the control signal line 36 (when the PMOS transistor Tp7 is in the "OFF" state), the PMOS transistor Tp7 is shut off.

Since the high level signal is applied to the control lines 36 and 37 when the amplification circuit 110 is active, the NAND logic circuit 330 substantially operates as a CMOS logic circuit consisting of the PMOS transistors Tp0 through Tp4 and the NMOS transistors Tn0 through Tn4. Similarly, the logic circuit 35 operates as a CMOS logic circuit. Therefore, the amplification circuit 110 of the third preferred embodiment can operate as the first and second inverters 330 and 35.

On the other hand, since the low level signal is applied to the control lines 36 and 37 when the amplification circuit 110 is inactive, the NMOS transistors T'n0 through T'n6 are shut off. Therefore, a standby current of the first and second inverters 330 and 35 can be kept to nearly "0".

Similarly to the first and second preferred embodiments, since all gate electrodes of the PMOS transistors Tp0 through Tp7 and the NMOS transistors Tn0 through Tn6 and T'n0 through T'n6 are formed to extend in the same direction, the theoretical threshold voltage Vth of the first and second inverters 330 and 35 can correspond even if the pitch error occurs.

According to the third preferred embodiment of the present invention, a gap exists or there is a difference between the theoretical threshold voltage of the first and second inverters 330 and 35 which causes the noise, can be inhibited. More further, the standby current can be reduced.

In the second and third preferred embodiments, similarly to the first preferred embodiment, an oscillation circuit can be provided by electrically connecting an oscillator to the first inverters 300 and 330.

While the present invention presents an example in which the amplification circuit is used to amplify the clock pulse signal, the present invention is not limited to this example, and the amplification circuit may be used to amplify another infinitesimal amplitude signals.

As described above, the amplification circuit and the oscillation circuit can inhibit the existence of a gap or a difference between the theoretical threshold voltage of the first and second inverters proceeding from the noise. More further, the amplification circuit and the oscillation circuit can reduce the standby current.

The present invention has been described with reference to illustrative embodiments, however, this description must not be considered to be confined only to the embodiments illustrated. Various modifications and changes of these illustrative embodiments and the other embodiments of the present invention will become apparent to one skilled in the art from reference to the description of the present invention. It is therefore contemplated that the appended claims will cover any such modifications or embodiments as fall within the true scope of the invention.

What is claimed is:

1. An amplification circuit, comprising:
 a first inverter having a plurality of first gate elements which are formed in a first active region, and an input terminal and an output terminal connected to a feedback resistor, wherein first gate electrodes of the first gate elements extend in a first direction; and
 a second inverter having a plurality of second gate elements which are formed in a second active region, wherein the second inverter receives an output signal from the first inverter and adjusts a waveform of the output signal, wherein second gate electrodes of the second gate elements extend in the first direction,
 wherein a gate length of all of the first gate electrodes is the same as a gate length of all of the second gate electrodes, and a gate width of all of the first gate electrodes which is defined by the first active region, is the same as a gate width of all of the second gate electrodes which is defined by the second active region.

2. The amplification circuit according to claim 1, wherein the first and second inverters include P type and N type gate elements.

3. The amplification circuit according to claim 2, wherein a ratio between gate width of the P type gate elements and gate width of the N type gate elements of the first inverter, is the same as a ratio between gate width of the P type gate elements and gate width of the N type gate elements of the second inverter.

4. The amplification circuit according to claim 2, wherein the P type and N type gate elements include an aggregate having a plurality of gate elements which extend in parallel with each other.

5. The amplification circuit according to claim 1, wherein a threshold voltage of the first inverter is the same as a threshold voltage of the second inverter.

6. The amplification circuit according to claim 1, wherein the first inverter is a CMOS logic circuit.

7. The amplification circuit according to claim 1, wherein the first inverter comprises a NOR logic circuit.

8. The amplification circuit according to claim 1, wherein the first inverter comprises a NAND logic circuit.

9. The amplification circuit according to claim 1, wherein the first and second inverters receive a power supply through a same power line.

10. The amplification circuit according to claim 1, wherein the amplification circuit amplifies a clock signal which is applied thereto through a coupling condenser.

11. An oscillation circuit, comprising:
a first inverter having a plurality of first gate elements which are formed in a first active region, and an input terminal and an output terminal connected to a feedback resistor and an oscillator, wherein first gate electrodes of the first gate elements extend in a first direction; and
a second inverter having a plurality of second gate elements which are formed in a second active region, wherein the second inverter receives an output signal from the first inverter and adjusts a waveform of the output signal, wherein second gate electrodes of the second gate elements extend in the first direction,
wherein a gate length of all of the first gate electrodes is the same as a gate length of all of the second gate electrodes, and a gate width of all of the first gate electrodes which is defined by the first active region, is the same as a gate width of all of the second gate electrodes which is defined by the second active region.

12. The oscillation circuit according to claim 11, wherein the first and second inverters include P type and N type gate elements.

13. The oscillation circuit according to claim 12, wherein a ratio between gate width of the P type gate elements and gate width of the N type gate elements of the first inverter, is the same as a ratio between gate width of the P type gate elements and gate width of the N type gate elements of the second inverter.

14. The oscillation circuit according to claim 12, wherein the P type and N type gate elements include an aggregate having a plurality of gate elements which extend in parallel with each other.

15. The oscillation circuit according to claim 11, wherein a threshold voltage of the first inverter is the same as a threshold voltage of the second inverter.

16. The oscillation circuit according to claim 11, wherein the first inverter is a CMOS logic circuit.

17. The oscillation circuit according to claim 11, wherein the first inverter comprises a NOR logic circuit.

18. The oscillation circuit according to claim 11, wherein the first inverter comprises a NAND logic circuit.

19. The oscillation circuit according to claim 11, wherein the first and second inverters receive a power supply through a same power line.

20. The oscillation circuit according to claim 11, wherein the amplification circuit amplifies a clock signal which is applied thereto through a coupling condenser.

* * * * *